United States Patent [19]
Chang et al.

[11] Patent Number: 5,950,097
[45] Date of Patent: *Sep. 7, 1999

[54] ADVANCED ISOLATION SCHEME FOR DEEP SUBMICRON TECHNOLOGY

[75] Inventors: Kuang-Yeh Chang, Los Gatos; Yowjuang William Liu, San Jose, both of Calif.; Mark I. Gardner, Ceder Creek; Frederick N. Hause, Austin, both of Tex.

[73] Assignee: Advanced Micro Devices, Inc., Sunnyvale, Calif.

[ * ] Notice: This patent is subject to a terminal disclaimer.

[21] Appl. No.: 08/698,828

[22] Filed: Aug. 16, 1996

Related U.S. Application Data

[63] Continuation of application No. 08/417,572, Apr. 6, 1995, Pat. No. 5,554,562.

[51] Int. Cl.⁶ .................................................. H01L 21/36
[52] U.S. Cl. ......................... 438/506; 438/479; 438/481; 438/505; 438/509; 438/508
[58] Field of Search .................................... 438/479, 481, 438/505, 506, 507, 508, 509, 526, 529

[56] References Cited

U.S. PATENT DOCUMENTS

| 4,536,945 | 8/1985 | Gray et al. ................................. 29/571 |
| 4,929,566 | 5/1990 | Beitman . |
| 5,008,208 | 4/1991 | Liu et al. . |
| 5,554,562 | 9/1996 | Chang et al. . |

FOREIGN PATENT DOCUMENTS

| 0 224 712 | 10/1986 | European Pat. Off. ........ H01L 21/82 |
| 0 547 902 A2 | 12/1992 | European Pat. Off. ........ H01L 21/20 |

*Primary Examiner*—Trung Dang
*Attorney, Agent, or Firm*—Jenkens & Gilchrist, A Professional Corporation

[57] ABSTRACT

An oxide layer is thermally grown over a semiconductor body, and openings are etched in the oxide layer to expose portions of the surface of the semiconductor body. Then, epitaxial regions are grown from the semiconductor body into the openings in the oxide layer, which epitaxial regions will eventually become the active regions of devices.

5 Claims, 6 Drawing Sheets

ADVANCED ISOLATION SCHEME FOR DEEP SUBMICRON TECHNOLOGY

This application is a continuation of application Ser. No. 08/417,572, filed Apr. 6, 1995, now U.S. Pat. No. 5,554,562.

FIELD OF THE INVENTION

This invention relates to semiconductor technology, and more particularly, to a method for forming isolation regions in semiconductor devices.

BACKGROUND OF THE INVENTION

A first prior art method for providing isolation of semiconductor devices is shown in FIGS. 1 and 2. As shown therein, after suitable masking, trenches 10 are etched into a silicon body 12. After removal of the masking, oxide 14 is deposited over the resulting structure into the trenches 10 (FIG. 1). Then, the oxide 14 is etched back to achieve a more planar structure, leaving oxide isolation regions 14A. However, because of the unevenness of the upper surface 16 of the deposited oxide 14 (FIG. 1), the top surfaces and side surfaces of silicon in the trenches becomes exposed to and are damaged by undesired contact with the etchant (FIG. 2).

To overcome this problem the following prior art method is described. As shown in FIG. 3, a silicon body 20 is provided, a thin layer 22 of oxide is thermally grown thereover to a thickness of for example 250 Å, and a nitride layer 24 is deposited over the oxide layer 22, to a thickness of for example 1500 Å. Then, after appropriate masking, a number of trenches 26, 28, 30 are etched through the nitride layer 24 and oxide layer 22, and into the silicon 20 to a chosen depth (FIG. 4). A thin layer of oxide 32, 34, 36 is then thermally grown in each respective trenches 26, 28, 30 to provide a high quality oxide adjacent the silicon 20, and then a layer of oxide 38 is deposited over the resulting structure, as shown in FIG. 4. It is necessary to grow the thin layer of oxide in each trench prior to the depositing of the oxide layer 38 because the depositing of oxide 38 directly on silicon 20 may lead to undesired charging of the deposited oxide 38, as the electrical characteristics of the deposited oxide 38 are not as good as those of thermal oxide.

It will be understood that the areas of silicon 40, 42, 44, 46 remaining between the trenches will eventually be device active areas.

During the growth of the thin oxide 32, 34, 36, small portions of oxide known as bird's beaks, as at 48, 50, are formed adjacent the top edges of each trench.

In a typical structure, it may well occur that some active areas are relatively close together while others are relatively far apart (see FIG. 4). Thus, when depositing the oxide layer 38 to eventually provide isolation oxide between active areas, while sufficient oxide may be deposited to fill in a trench between closely spaced regions, the deposited oxide 38 is spread out and thinned to a point where it may not completely fill the trench between the widely spaced active areas as at 44, 46. Then even after a mechanical chemical polishing step, a non-planar device may well result. To avoid this problem, a rather large amount of oxide 38' may need to be deposited to insure that a trench between widely spaced active areas is properly filled. This results in a highly nonplanar device as shown at FIG. 5.

In the past, in dealing with this problem, an etching step was undertaken using "reverse" photoresist masks 52, 54, 56 (FIG. 5) for blocking off those areas wherein it was undesirable to etch away material in an attempt to gain a generally more planar device. During a subsequent etching step, oxide is removed from the exposed areas of the oxide layer 38' areas, to achieve a more planar device (FIG. 6), so that further etching, after removal of the masks 52, 54, 56, leads to more a planar device prior to polishing (FIG. 7). This of course results in an additional mask and etch step which adds to manufacturing inefficiency.

Furthermore, upon removal of the nitride and oxide layers 22, 24 to reach what will be the active areas 40, 42, 44, 46 of the silicon 20, a portion of the oxide in each respective trench 26, 28, 30 remains so as to protrude above the rest of the structure (FIG. 8), again resulting in a non-planar device.

SUMMARY OF THE INVENTION

In accordance with the present invention, an oxide layer is thermally grown over a semiconductor body such as silicon, and openings are etched in the oxide layer to expose portions of the surface of the silicon. Then, epitaxial regions are grown from the silicon into the openings in the oxide layer, which epitaxial regions will eventually become the active areas of devices.

DESCRIPTION OF THE PREFERRED EMBODIMENT

Figure 1:
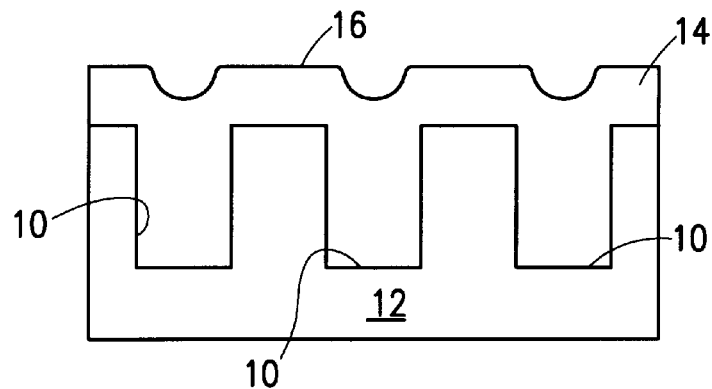
FIGS. 1–8 show prior art methods for planarizing semiconductor devices.
Figure 2:
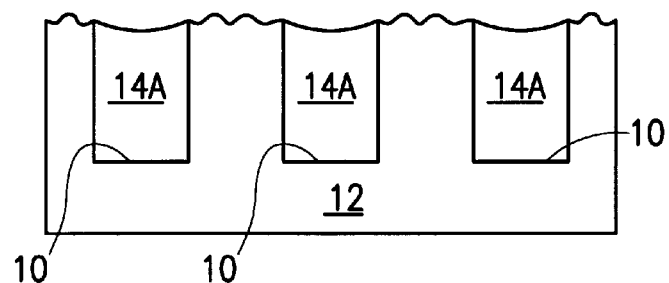
Figure 3:
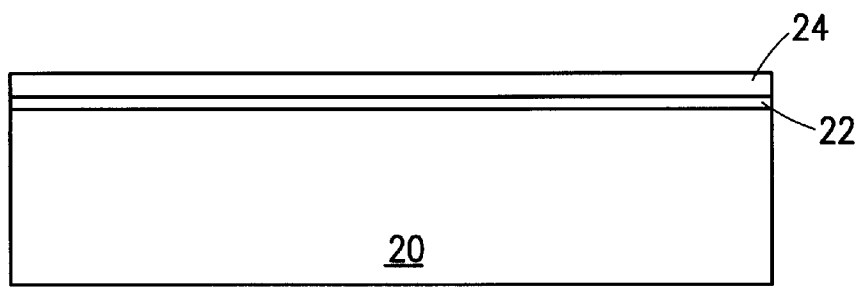
Figure 4:
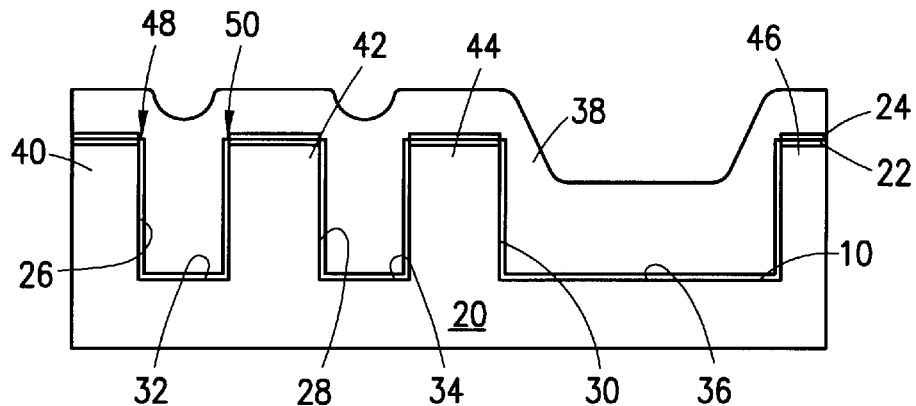
Figure 5:
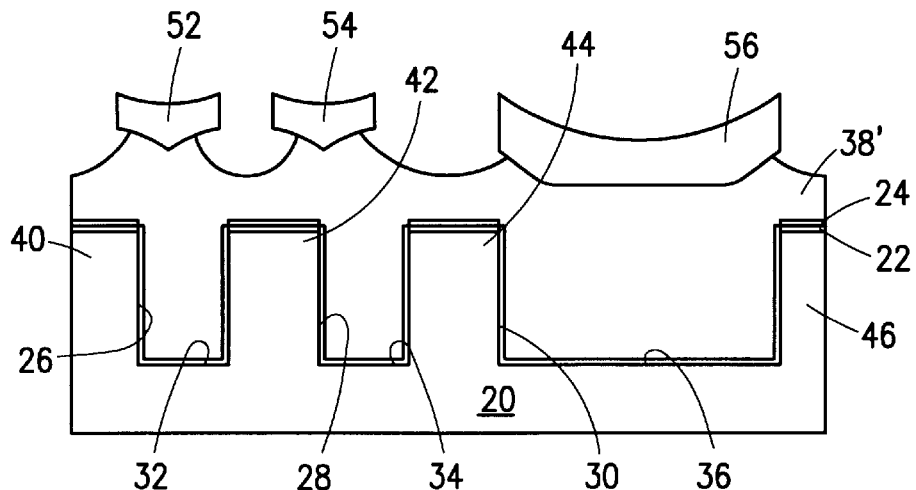
Figure 6:
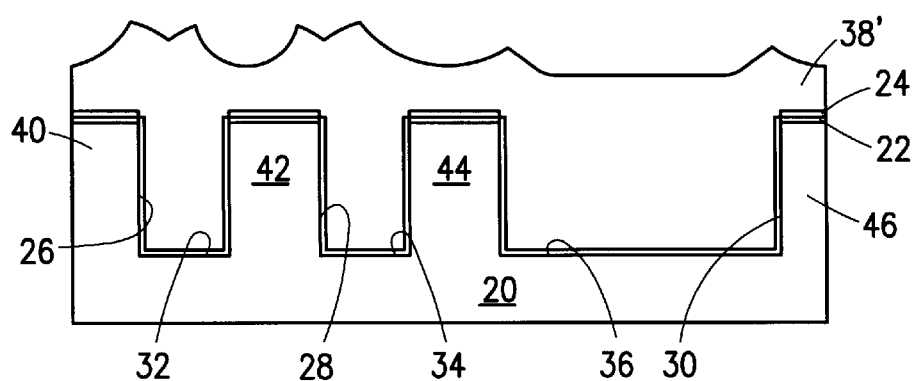
Figure 7:
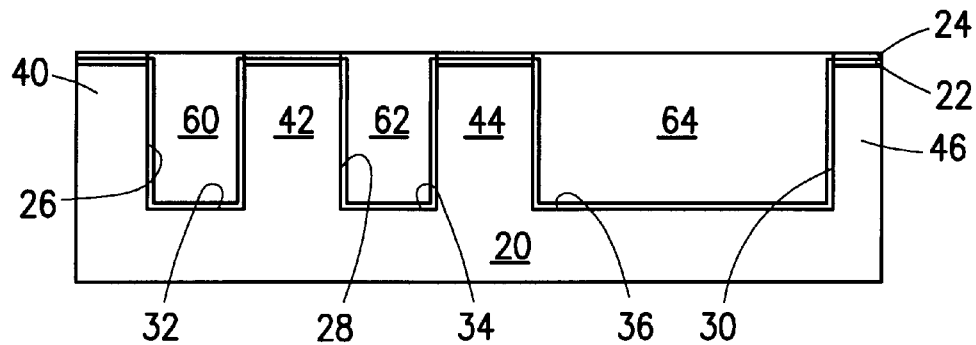
Figure 8:
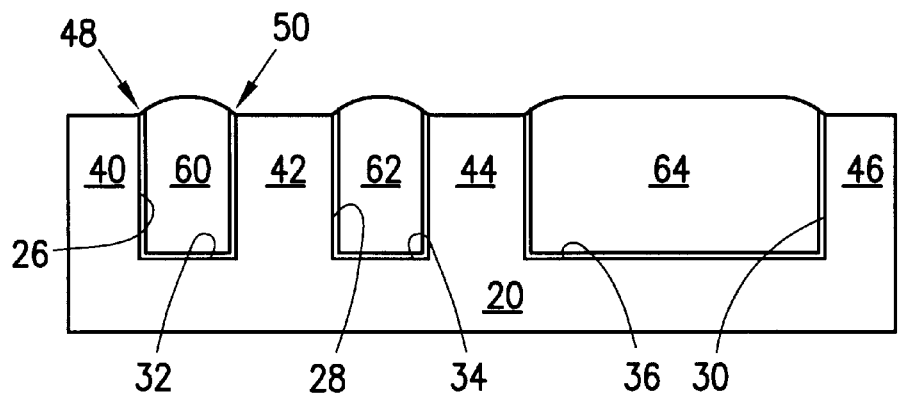
Figure 9:
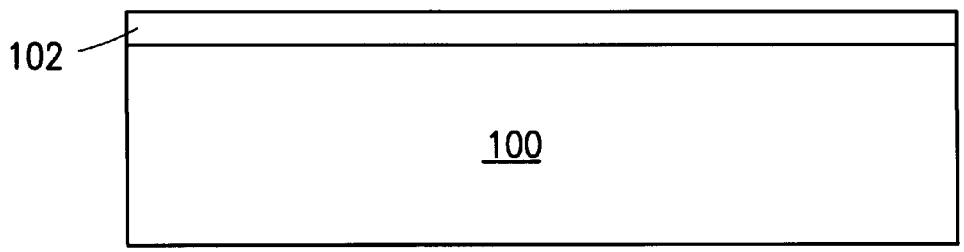
FIGS. 9–13 show the present method for forming a planar semiconductor devices.

The present process is shown in FIGS. 9–13. As shown in FIG. 9, starting with a silicon substrate 100, a thick layer of oxide 102 is thermally grown thereon to a thickness of, for example, 3000–8000 Å. Then, the oxide 102 is masked and etched to form openings 104, 106, 108, in the oxide 102 to expose portions of the silicon substrate 100. Epitaxial regions 110, 112, 114 are then grown at for example 1100–1300° C. in the openings 104, 106, 108 now defined in the oxide layer 102 (FIG. 10), which epitaxial regions 110, 112, 114 will eventually become active areas.

Figure 10:
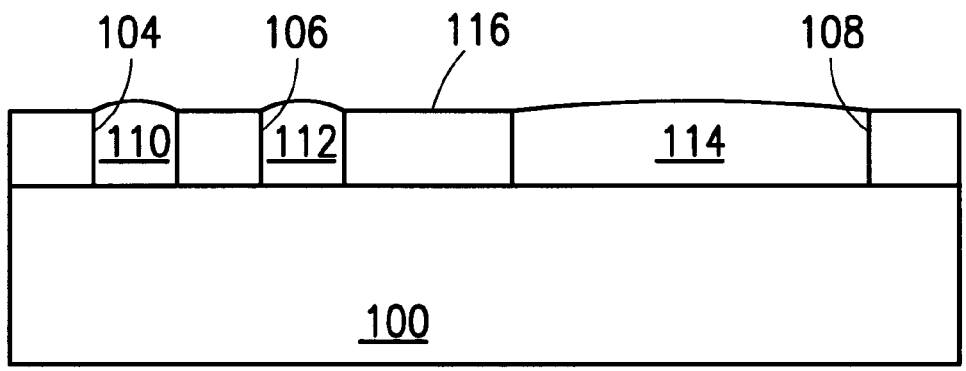

As noted in FIG. 10, the epitaxial regions 110, 112, 114 as grown will extend slightly beyond the top surface 116 of the oxide layer 102, but to a substantially uniform extent. It will also be noted that it does not matter how far apart or how large the active areas 110, 112, 114 are, because the epitaxial growth rate is approximately the same over the substrate 100. Also, the present process has the advantage that epitaxial silicon, is in general of better quality than the silicon substrate material in the active areas of the prior art.

Figure 11:
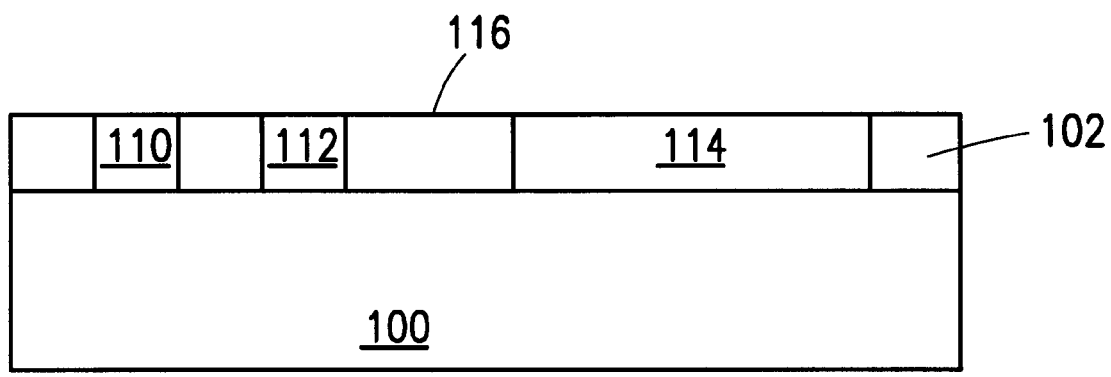

Then, a chemical mechanical polish is undertaken to planarize the resulting structure, as shown in FIG. 11, so that the resulting structure is now substantially totally flat, avoiding the bird's beak problem as set forth above and also avoiding the problem that in the prior art upon removal of thin oxide and nitride layers, the remaining oxide protrudes above the silicon surface.

The problem of damage as set forth in the first described prior art system above is avoided. Additionally, there is no need to deal with the reverse mask method described above, with the problems attendant thereto.

Figure 12:
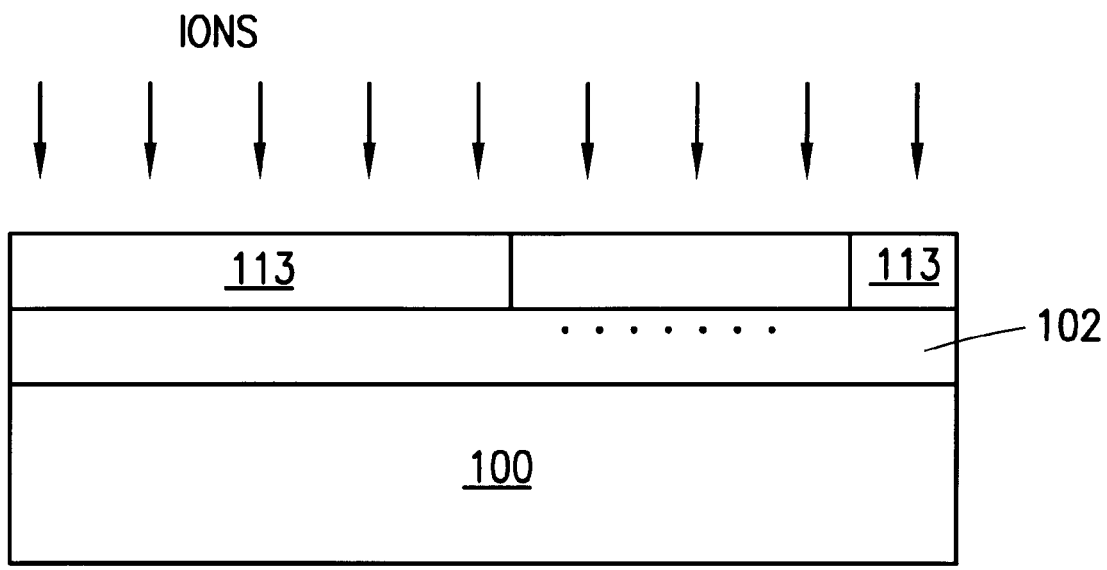
Figure 13:
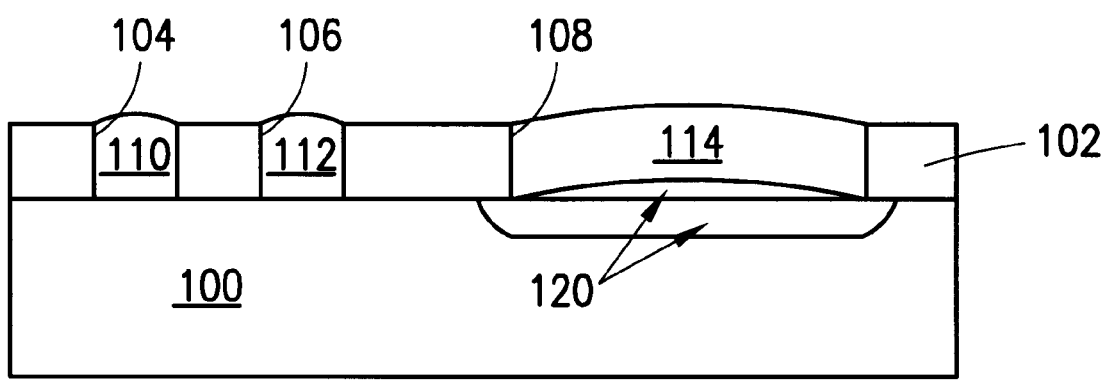

The present process has an additional significant additional advantage, i.e., prior to etching the openings 104, 106, and 108 an ion implant of whatever type chosen may be undertaken (after suitable masking 113) as shown at FIG. 12. Example of energies and dosages are as follows;

|  | N Well | P Well |
|---|---|---|
| ion | Phosphorous | Boron |
| energy | 400–600 Kev | 150–250 Kev |
| dose | $1 \times 10^{12}$–$1 \times 10^{13}$ | $1 \times 10^{12}$–$1 \times 10^{13}$ |

Then after openings 104, 106, 108 are provided and during growth of the epitaxial regions 110, 112, 114 (FIG. 13), the implant is driven into the body 100 and also extends into the epitaxial region 114 during growth, to form well 120. While growing the epitaxial regions 110, 112, 114 the ions automatically form a retrograde well 120, i.e., the well 120 has a relatively heavy concentration of impurities near its bottom (in the silicon substrate 100) and a relatively light concentration near its top (in the epitaxial region 114). Such a well 120, as is well known, suppresses device latchup and reduces device capacitance with the heavier doping at the bottom helping on the device short channel punchthrough problem. Also the heavier dose at the sidewalls of the epitaxial region 114 helps prevent formation of parasitic transistors.

It will further be understood that this implant can be at a chosen energy level to provide a chosen well profile.

Figure 14:
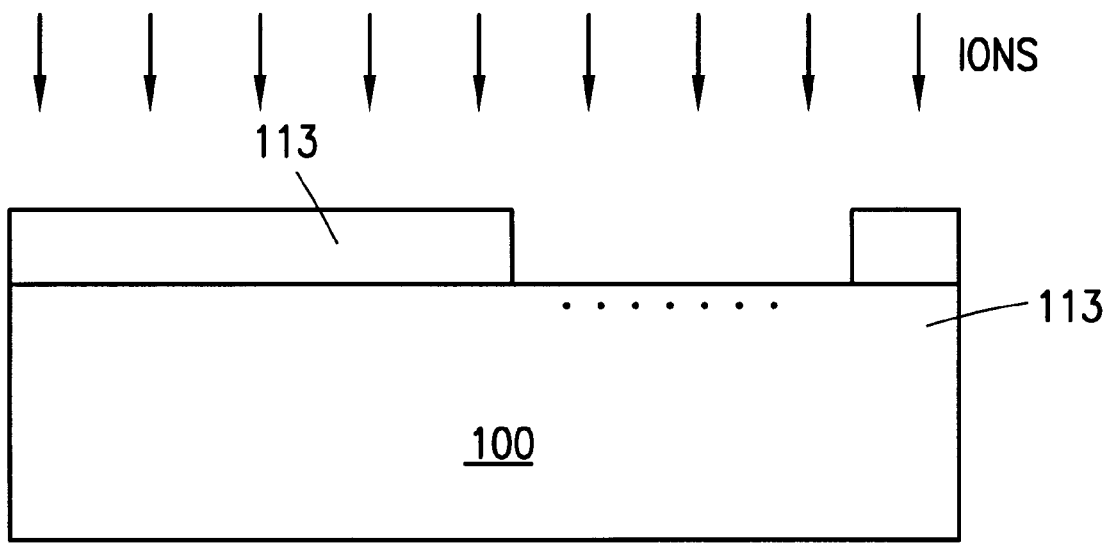
FIGS. 14 and 15 show alternative embodiments of the invention.

As an alternative (FIG. 14), the implant can be performed before the growth of the oxide layer 102 and after appropriate masking 113.

Both methods have advantages attendant thereto. For example, with the implant being performed after the growth of the oxide layer 102, there will be no diffusion of the implant due to the growth of the oxide layer 102. On the other hand, if the implant is done before the growth of oxide layer 102, lower implant energy can be used.

Figure 15:
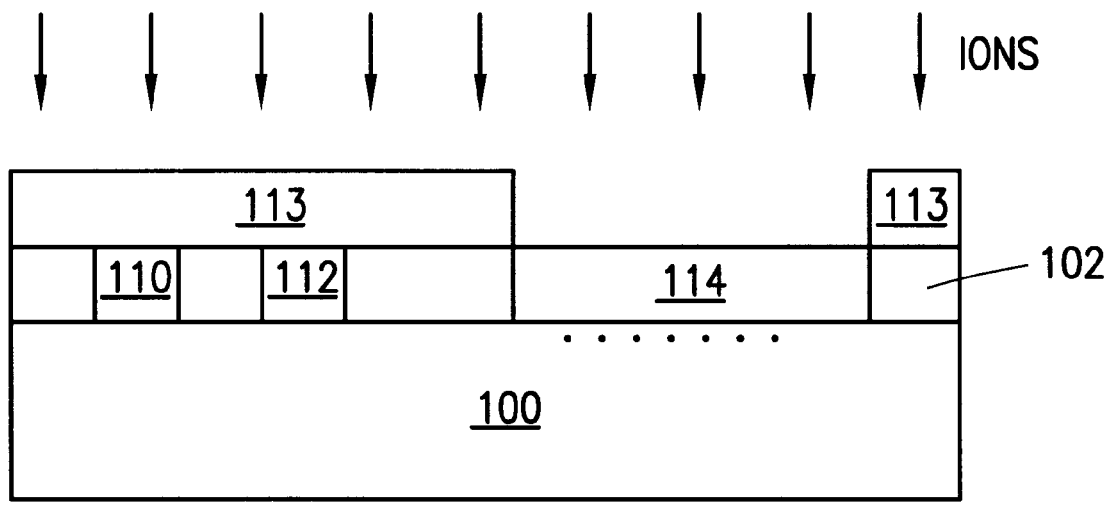

As a further alternative, the implant can be performed through the polished epitaxial region 114 subsequent to growth thereof and, for example, after polishing thereof (FIG. 15).

It will be further understood that through the above-cited process, a field implant mask as normally used can be avoided.

Since the oxide 102 is grown rather than deposited the resulting structure is provided with a high quality oxide isolation rather than the relatively lower quality of deposited oxide. Furthermore, several masking steps are avoided as compared to the prior art.

We claim:

1. A method of forming a semiconductor device having at least one retrograde well comprising:

providing a semiconductor body;

providing an oxide layer over the semiconductor body;

implanting ions of a chosen conductivity in a selected location through the oxide layer into the semiconductor body;

providing an opening through the oxide layer to the semiconductor body;

chemically mechanically polishing the epitaxial layer providing semiconductor material in the opening of the oxide layer whereby the at least one retrograde well is formed.

2. The method of claim 1 and further comprising the step of thermally growing the oxide layer on the semiconductor body.

3. The method of claim 1 and further comprising the step of growing an epitaxial layer in the opening of the oxide layer to provide semiconductor material therein.

4. The method of claim 3 and further comprising the step of implanting ions of a chosen conductivity type into the semiconductor body subsequent to providing an oxide layer over the semiconductor body, and prior to providing an opening through the oxide layer to the semiconductor body, in the general area wherein an opening will be provided through the oxide layer to the semiconductor body, the growing of the epitaxial layer providing drive-in of the implanted ions to form a retrograde well.

5. The method of claim 3 and further comprising the step of implanting ions of a chosen conductivity type through the epitaxial layer provided in the opening of the oxide layer and into the semiconductor body.

* * * * *